United States Patent
Lee (10) Patent No.: US 9,679,853 B2
(45) Date of Patent: Jun. 13, 2017

(54) PACKAGE-ON-PACKAGE TYPE PACKAGE INCLUDING INTEGRATED CIRCUIT DEVICES AND ASSOCIATED PASSIVE COMPONENTS ON DIFFERENT LEVELS

(71) Applicant: Jong-joo Lee, Suwon-si (KR)

(72) Inventor: Jong-joo Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 575 days.

(21) Appl. No.: 13/963,598

(22) Filed: Aug. 9, 2013

(65) Prior Publication Data

US 2014/0097513 A1    Apr. 10, 2014

(30) Foreign Application Priority Data

Oct. 8, 2012   (KR) .................. 10-2012-0111389

(51) Int. Cl.
| | |
|---|---|
| *H05K 7/00* | (2006.01) |
| *H01L 23/538* | (2006.01) |
| *H01L 23/498* | (2006.01) |
| *H01L 25/10* | (2006.01) |
| *H01L 23/00* | (2006.01) |

(52) U.S. Cl.
CPC ...... *H01L 23/538* (2013.01); *H01L 23/49816* (2013.01); *H01L 25/105* (2013.01); *H01L 24/73* (2013.01); *H01L 2224/32145* (2013.01); *H01L 2224/32225* (2013.01); *H01L 2224/48145* (2013.01); *H01L 2224/48227* (2013.01); *H01L 2224/73265* (2013.01); *H01L 2225/0651* (2013.01); *H01L 2225/06506* (2013.01); *H01L 2225/06562* (2013.01); *H01L 2225/1023* (2013.01); *H01L 2225/1058* (2013.01); *H01L 2924/15192* (2013.01); *H01L 2924/15311* (2013.01); *H01L 2924/15331* (2013.01); *H01L 2924/19105* (2013.01)

(58) Field of Classification Search
CPC ............ H01L 23/49816; H01L 23/538; H01L 25/105; H05K 1/14; H05K 1/18; H05K 1/0231; H05K 1/111; H05K 1/141–1/144; H05K 3/306; H05K 2201/2036
USPC ................ 361/760–764, 770–790, 795, 803; 257/685–688, 777, 787–790
See application file for complete search history.

(56) References Cited

U.S. PATENT DOCUMENTS

| | | | |
|---|---|---|---|
| 7,132,311 B2 * | 11/2006 | Akiba | H01L 21/565 257/E21.504 |
| 7,242,081 B1 | 7/2007 | Lee | |
| 7,248,482 B2 * | 7/2007 | Asahi | H01L 25/165 257/E25.031 |
| 7,569,918 B2 | 8/2009 | Gerber et al. | |

(Continued)

FOREIGN PATENT DOCUMENTS

| | | |
|---|---|---|
| JP | 2006-344789 | 12/2006 |
| KR | 100728529 B1 | 6/2007 |
| KR | 1020090021452 A | 3/2009 |

*Primary Examiner* — Tuan T Dinh
(74) *Attorney, Agent, or Firm* — Myers Bigel, P.A.

(57) ABSTRACT

A package-on-package (PoP)-type package includes a first semiconductor package having a first passive element and a first semiconductor device mounted on a first substrate, and a second semiconductor package having a second semiconductor device mounted on a second substrate. The first passive element is electrically connected to the second semiconductor device. Related devices are also discussed.

13 Claims, 7 Drawing Sheets

(56) References Cited

U.S. PATENT DOCUMENTS

| | | | |
|---|---|---|---|
| 7,868,441 B2 | 1/2011 | Eaton et al. | |
| 8,049,320 B2 | 11/2011 | Harper et al. | |
| 8,102,032 B1* | 1/2012 | Bolognia | H01L 23/3128 |
| | | | 257/659 |
| 8,125,066 B1 | 2/2012 | Kang | |
| 2006/0245308 A1* | 11/2006 | Macropoulos | H05K 1/024 |
| | | | 369/1 |
| 2008/0088001 A1* | 4/2008 | Kim | H01L 23/49805 |
| | | | 257/686 |
| 2008/0157316 A1 | 7/2008 | Yang | |
| 2008/0157325 A1* | 7/2008 | Chow | H01L 23/3128 |
| | | | 257/686 |
| 2008/0315387 A1* | 12/2008 | Gerber | H01L 25/162 |
| | | | 257/686 |
| 2009/0108431 A1* | 4/2009 | Farley | H01L 25/105 |
| | | | 257/686 |
| 2009/0152674 A1* | 6/2009 | Uchida | H01L 23/5227 |
| | | | 257/531 |
| 2010/0224977 A1* | 9/2010 | Kim | H01L 21/76898 |
| | | | 257/686 |
| 2010/0244585 A1* | 9/2010 | Tan | H01G 4/183 |
| | | | 307/109 |
| 2011/0241168 A1 | 10/2011 | Kim et al. | |
| 2012/0020040 A1 | 1/2012 | Lin et al. | |

* cited by examiner

PACKAGE-ON-PACKAGE TYPE PACKAGE INCLUDING INTEGRATED CIRCUIT DEVICES AND ASSOCIATED PASSIVE COMPONENTS ON DIFFERENT LEVELS

CROSS-REFERENCE TO RELATED APPLICATION

This application claims the benefit of Korean Patent Application No. 10-2012-0111389, filed on Oct. 8, 2012, in the Korean Intellectual Property Office, the disclosure of which is incorporated herein in its entirety by reference.

BACKGROUND

The present disclosure relates to package-on-package type packages.

Due to demand for high speed and low voltage semiconductor devices, various types of passive elements for use in conjunction with semiconductor circuits may be used. However, the overall thickness of a package may increase, because the height of a passive element is often higher than the height of a semiconductor chip, and also because (from a foot-print perspective) the surface area of the package may increase due to the presence of the passive element. Accordingly, there may be increased demand for semiconductor devices that can provide stable performance without increasing the surface area and/or thickness of the package.

SUMMARY

The present inventive concept provides package-on-packages (PoPs) having reduced thickness, small size, and stable efficiency. The present inventive concept also provides PoP solid state drives having reduced thickness, small size, and stable efficiency.

According to some aspects of the present inventive concepts, a package-on-package (PoP)-type package includes a first package comprising a first integrated circuit device and a passive component, and a second package comprising a second integrated circuit device having at least one dimension smaller than that of the passive component. The first and second packages are stacked, and an electrical connection is provided between the passive component and the second integrated circuit device.

In some embodiments, the electrical connection between the passive component and the second integrated circuit device may consist of a conductive wire and/or a conductive terminal.

In some embodiments, the PoP-type package may be free of a direct electrical connection between the passive component and the first integrated circuit device.

In some embodiments, the passive component may be associated with operation of the second integrated circuit device. The second integrated circuit device may be configured to control operation of the first integrated circuit device.

In some embodiments, the first integrated circuit device may be a semiconductor memory device. For example, the first integrated circuit device may be a stack of semiconductor memory chips. The stack may have a height greater than or equal to that of the passive component.

According to an aspect of the present inventive concept, there is provided a package-on-package (PoP)-type package, the package including: a first semiconductor package including a first passive element and a first semiconductor device mounted on a first substrate; a second semiconductor package including a second semiconductor device mounted on a second substrate, wherein the first passive element is electrically connected to the second semiconductor device.

The first passive element may be directly electrically connected to the second semiconductor device. More particularly, the first passive element may be electrically connected to the second semiconductor device only through an electrical wiring and/or a terminal between the first passive element and the second semiconductor device. Also, the first passive element may not be directly electrically connected to any semiconductor device in the first semiconductor package.

According to an aspect of the present inventive concept, the second semiconductor package may further include at least one second passive element mounted on the second substrate. The first passive element may be directly electrically connected to the second passive element. Also, the second passive element may be directly electrically connected to the second semiconductor device.

Also, the first semiconductor package may be located on a top surface of the second semiconductor package. Also, a vertical height of the first passive element may be greater than a vertical height of the second semiconductor device.

More particularly, sides and the top surface of the first semiconductor device may be encapsulated by a molding element. In this case, the height of the first passive element may be lower than a height of the molding element.

The second substrate may further include a terminal that may be electrically connected to an external device.

The first passive element may be electrically connected to the second semiconductor device through a first pathway. Also, the first passive element may be electrically connected to a device other than the second semiconductor device through a second pathway. Herein, the first pathway and the second pathway may have a pass-through structure such that the first pathway and the second pathway do not overlap. The first pathway and the second pathway may have a stub structure such that the first pathway and the second pathway overlap at least partially.

According to some embodiments of the present inventive concept, the second semiconductor package may not include the passive element.

The first passive element may be at least one of the elements selected from the group consisting of a resistor, a capacitor, an inductor, a thermistor, an oscillator, a ferrite bead, an antenna, a varistor, and a crystal.

Also, the first semiconductor device may be a memory device, for example, a non-volatile memory device. Also, the second semiconductor device may be a controller chip for controlling the memory device.

According to an aspect of the present inventive concept, there is provided a PoP-type solid state drive (SSD) including a first semiconductor package comprising a first semiconductor device and a second semiconductor package connected to the first semiconductor package by stacking and including a second semiconductor device, the first semiconductor package comprising at least one passive element electrically connected to the second semiconductor device.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

The above and other features and advantages of the present inventive concept will become more apparent by describing in detail exemplary embodiments thereof with reference to the attached drawings in which.

DETAILED DESCRIPTION OF THE EMBODIMENTS

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity.

Like numbers indicate like elements throughout. As used herein the term "and/or" includes any and all combinations of one or more of the associated listed items. It will be understood that when an element is referred to as being "connected" or "coupled" to another element, it can be directly connected or coupled to the other element or intervening elements may be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
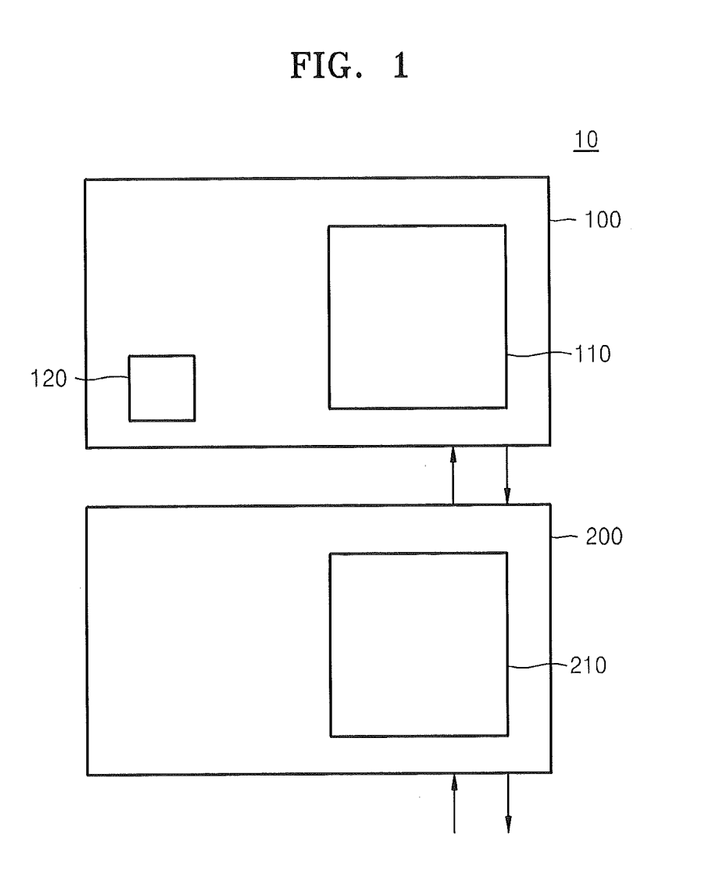
FIG. 1 is a schematic diagram showing components of a package-on-package (PoP) type package according to some embodiments of the present inventive concept.

FIG. 1 is a schematic diagram illustrating components of a package-on-package (PoP) type package 10 according to some embodiments of the present inventive concept.

Referring to FIG. 1, a first semiconductor package 100 and a second semiconductor package 200 may be configured to communicate with each other. Also, the first semiconductor package 100 and/or the second semiconductor package 200 may be configured to communicate with an external device. In FIG. 1, the second semiconductor package 200 is configured to communicate with the external device, however, the present inventive concept is not limited thereto and the first semiconductor package 100 may be configured to communicate with the external device in some embodiments.

The first semiconductor package 100 and the second semiconductor package 200 may respectively include the first semiconductor device 110 and the second semiconductor device 210. Each of the first semiconductor device 110 and the second semiconductor device 210 may include one or more of a semiconductor die, a semiconductor package, or a plurality of semiconductor dies with stacked structures. The first semiconductor device 110 and the second semiconductor device 210 may be referred to as active components.

The first semiconductor package 100 may include a first passive component or element 120. The first passive element 120 may be, for example, a resistor, a capacitor, an inductor, a thermistor, an oscillator, a ferrite bead, an antenna, a varistor, and/or a crystal. However, the first passive element 120 is not limited thereto, and may be any other passive element.

The first passive element 120 may be electrically connected to the second semiconductor device 210. More particularly, the first passive element 120 may be directly electrically connected to the second semiconductor device 210. Herein, a direct electrical connection between the first passive element 120 and the second semiconductor device 210 includes only conductive elements that are dedicated to delivery of electrical signals and/or data and/or current therebetween. In greater detail, the direct electrical connection between the first passive element 120 and the second semiconductor device 210 may be a physical connection consisting only of wiring and/or conductive terminal(s).

The wiring can include not only conductive wiring formed parallel with a main surface of a substrate, but also a via formed vertical or perpendicular to the main surface of the substrate, a via formed inside a via hole in the substrate, a conductive layer on an inner surface of a through-hole in the substrate, and/or a bonding wire.

Also, the conductive terminal can include all types of terminals for delivering electrical signals and/or data and/or currents in conjunction with the wiring. The terminal may be an electrode pad formed on the surface of the substrate or in the middle of the substrate, a solder ball, a solder bump, a pin, a lead line, a bump pad, a ball pad, a bonding pad, etc. Thus, the electrical connection between the passive element 120 and the second semiconductor device 210 may consist of a conductive wire, pad, via, pin, and/or bump structure.

More particularly, the first passive element 120 is included in the first semiconductor package 100; however, the first passive element 120 may not be directly electrically connected to the first semiconductor device 110 or any semiconductor device in the first semiconductor package 100. This means that the first passive element 120 is electrically connected to the second semiconductor device 210 only through electrical wiring and/or one or more terminals. In greater detail, if the first passive element 120 is electrically connected to the second semiconductor device 210 via another semiconductor device, then the first passive element 120 is not directly electrically connected to the second semiconductor device 210.

The first semiconductor package 100 and the second semiconductor package 200 may be stacked to form a PoP structure. The first semiconductor package 100 and the second semiconductor package 200 may each be a semiconductor package having any structure, and the structure is not specifically limited. For example, the second semiconductor package 200 may be stacked on the first semiconductor package 100, or the first semiconductor package 100 may be stacked on the second semiconductor package 200.

Figure 2:
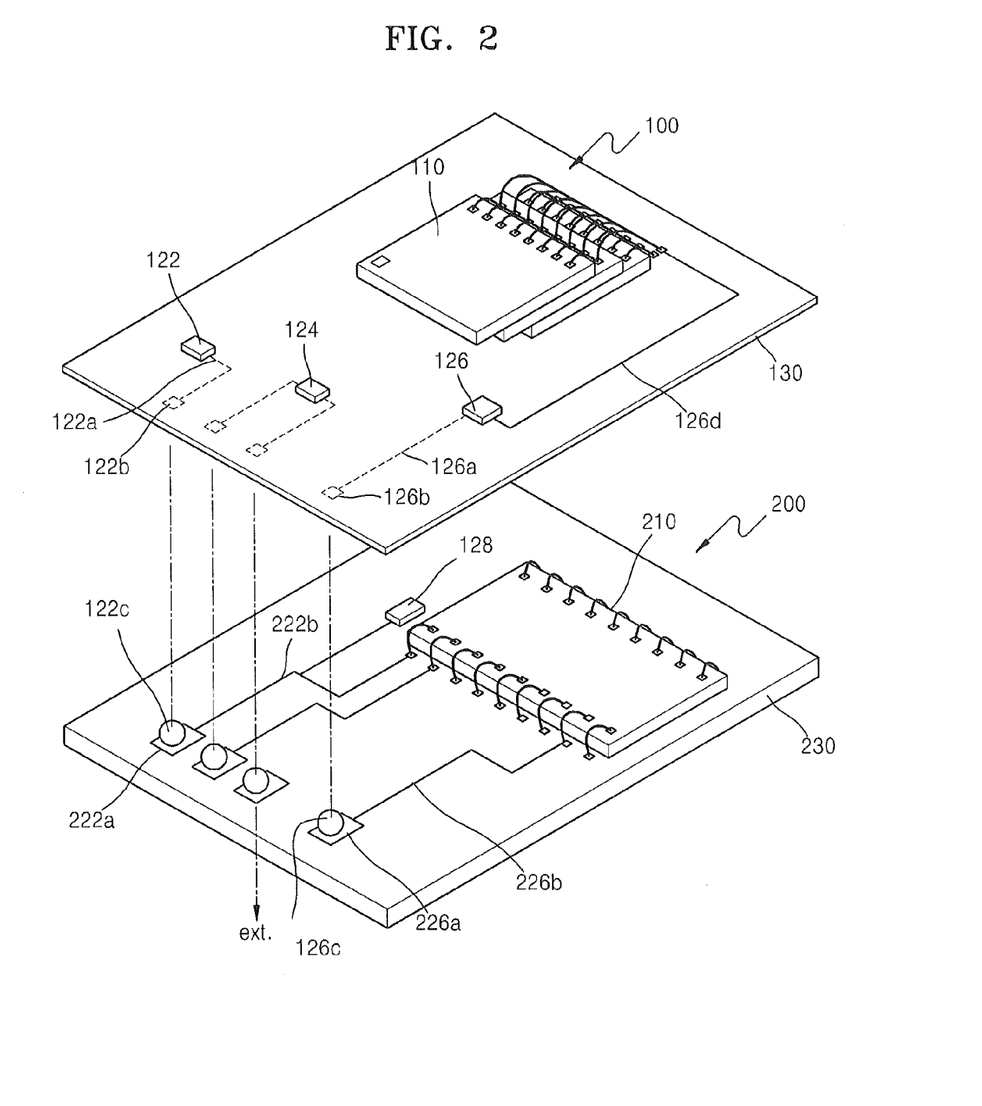
FIG. 2 is an exploded perspective view showing a PoP-type package according to some embodiments of the present inventive concept.

FIG. 2 is an exploded perspective view schematically showing a PoP-type package according to some embodiments of the present inventive concept.

Referring to FIG. 2, the first passive elements 122 and 124 and the first semiconductor device 110 are mounted on the first substrate 130. Also, the second semiconductor device 210 is mounted on the second substrate 230. The first semiconductor device 110 may be any semiconductor device. For example, the first semiconductor device 110 may be a memory device but is not limited thereto. Also, the second semiconductor device 210 may be any semiconductor device. For example, the second semiconductor device 210 may be a memory controller but is not limited thereto.

A first substrate 130 and a second substrate 230 may each include a printed circuit board, a flexible printed circuit board, and/or a tape substrate; however, the present inventive concept is not limited thereto.

As shown in FIG. 2, the first passive element 122 is connected to a wiring 122a on the first substrate 130 and may be electrically connected to a bump pad 122b formed on the lower surface of the first substrate 130 and a solder bump 122c physically connected to the bump pad 122b. Also, the solder bump 122c is electrically connected to the bump pad 222a by contacting the bump pad 222a on the second substrate 230 and the bump pad 222a is electrically connected to the second semiconductor device 210 through a wiring 222b.

An end of another first passive element 124 is electrically connected to the second semiconductor device 210 in the same manner as the passive element 122 above, and the other end of passive element 124 may be directly electrically connected to another device through wiring and/or a connecting terminal. For example, another device to which the other end of passive element 124 is connected may be a device in the second semiconductor package 200 or an external device. FIG. 2 shows an example where the other end of passive element 124 is connected to an external device (ext); however, the spirit and the scope of the present inventive concept are not limited thereto. More particularly, the other device (to which the other end of the first passive element 124 is connected) may be a device that is not located in the first semiconductor package 100 in some embodiments.

The first passive elements 122 and 124 are directly electrically connected to the second semiconductor device 210 mounted on the second substiate 230; however, the first passive elements 122 and 124 may not be directly electrically connected to the first semiconductor device 110 mounted on the first substrate 130.

On the other hand, an arbitrary passive element 126 may be provided on the first substrate 130. The arbitrary passive element 126 may be directly electrically connected to the first semiconductor device 110 mounted on the first substrate 130 through a wire 126d. Also, the arbitrary passive element 126 may be electrically connected to a bump pad 126b and a solder bump 126c physically connected to the bump pad 126b by a wiring 126a formed on the first substrate 130. Also, the solder bump 126c is electrically connected to a bump pad 226a provided on the second substrate 230, and the bump pad 226a may be directly electrically connected to the second semiconductor device 210 through a wiring 226b.

As shown in FIG. 2, the first passive elements 122 and 124 are not directly electrically connected to the first semiconductor device 110 mounted on the first substrate 130; however, the arbitrary passive element 126 may be directly electrically connected to the first semiconductor device 110 mounted on the first substrate 130.

The first passive elements 122 and 124 and the arbitrary passive element 126 may each include, for example, a resistor, a capacitor, an inductor, a thermistor, an oscillator, a ferrite bead, an antenna, a varistor, and/or a crystal. However, the first passive elements 122 and 124 and/or the arbitrary passive element 126 are not limited thereto and may be any other passive element.

Figure 3:
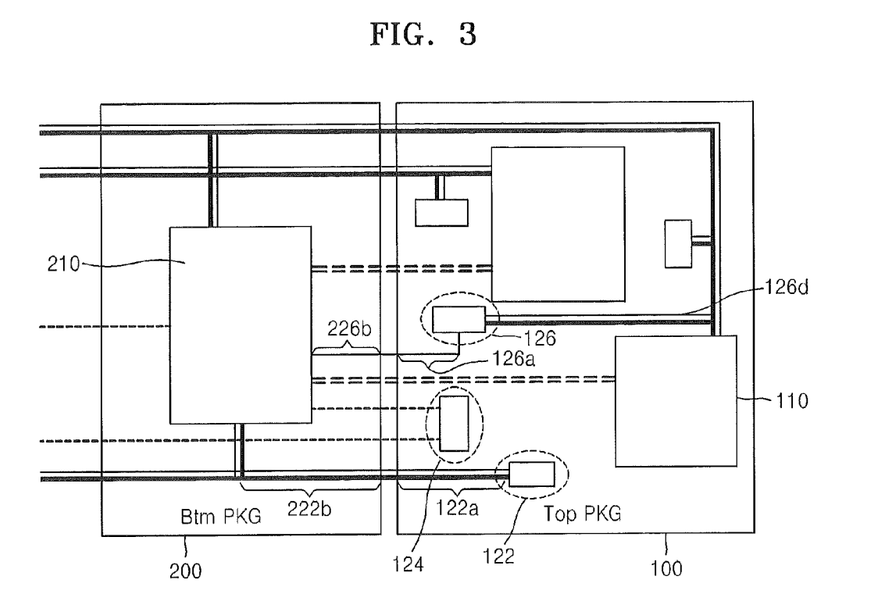
FIG. 3 is a circuit diagram schematically showing a PoP-type package according to some embodiments of the present inventive concept.

FIG. 3 is a circuit diagram schematically showing a PoP-type package according to some embodiments of the present inventive concept.

Referring to FIG. 3, the first semiconductor device 110 may be provided in the first semiconductor package 100 and the second semiconductor device 210 may be provided in the second semiconductor package 200. The semiconductor device 110 and the second semiconductor device 210 may be directly or indirectly connected to each other.

The first passive element 122 is included in the first semiconductor package 100 and is not connected to a semiconductor device in the first semiconductor package 100, and may only be directly electrically connected to the second semiconductor device 210 in the second semiconductor package 200. Similarly, the first passive element 124 is included in the first semiconductor package 100 and is not connected to a semiconductor device in the first semiconductor package 100, and may only be directly electrically connected to the second semiconductor device 210 in the second semiconductor package 200.

On the other hand, the arbitrary passive element 126 is included in the first semiconductor package 100 and may be directly electrically connected to the first semiconductor device 110 in the first semiconductor package 100 and/or the second semiconductor device 210 in the second semiconductor package 200.

Figure 4:
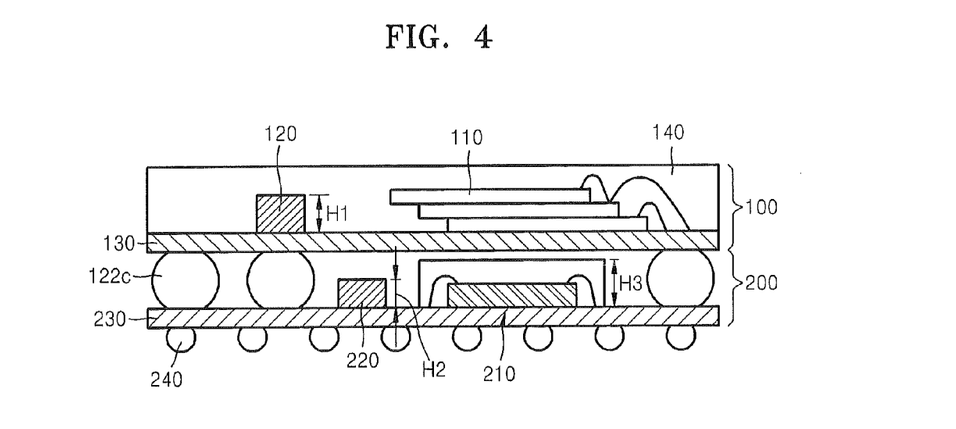
FIG. 4 is a cross-sectional view showing a PoP-type package according to some embodiments of the present inventive concept.

FIG. 4 is a cross-sectional view showing a PoP-type package according to some embodiments of the present inventive concept Referring to FIG. 4, the first passive element 120 and the first semiconductor device 110 may be provided on the first substrate 130. The first semiconductor device 110 is illustrated as including a plurality of stacked semiconductor chips in FIG. 4; however, the first semiconductor device 110 may consist of only one semiconductor chip in some embodiments. The first semiconductor device 110 may be electrically connected to the first substrate 130 by a bonding wire and/or a solder bump.

Also, the first semiconductor device 110 may be encapsulated by a molding element 140. Sides and a top surface of the first semiconductor device 110 may be encapsulated by a molding element 140. The molding element 140 may encapsulate the first passive element 120 as well. For this, a thickness or vertical height (H1) of the first passive element 120 (corresponding to 122 in FIG. 2 and to 124 in FIG. 3) may be lower than a thickness or vertical height of the molding element 140. Furthermore, the vertical height (H1) of the first passive element 120 may be less than or equal to a vertical height or thickness of the first semiconductor device 110. The molding element 140 may be a material such as an epoxy molding compound (EMC); however, the present inventive concept is not limited thereto.

In the second semiconductor package 200, the second semiconductor device 210 may be provided on the second substrate 230, and the second passive element 220 may further be provided on the second substrate 230. In FIG. 4, an active surface of the second semiconductor device 210 is a top surface. However, the second semiconductor device 210 may be mounted such that the active surface of the second semiconductor device 210 is a bottom surface. For example, the second semiconductor device 210 may be flip-chip mounted on the second substrate 230.

The second passive element 220 may be identical to or different from the first passive element 120. The second passive element 220 may be, for example, a capacitor, an inductor, a thermistor, an oscillator, a ferrite bead, an antenna, a varistor, and/or a crystal.

When the first passive element 120 and the second passive element 220 are respectively mounted on the first substrate 130 and the second substrate 230, the vertical height H1 of the first passive element 120 may be higher than a vertical height H2 of the second passive element 220. For example, a level of a top surface of the second passive element 220 may be identical to or lower than a top surface of the second semiconductor device 210. In some embodiments, the vertical height H1 of the first passive element 120 may be higher than a vertical height H3 of the second semiconductor device 210. More generally, at least one dimension of the first passive element 120 may be larger than a corresponding dimension of the second semiconductor device 210.

The first semiconductor package 100 and the second semiconductor package 200 may form a PoP-type package by being vertically disposed or stacked with respect to each other. The first semiconductor package 100 and the second semiconductor package 200 may be electrically connected by one or more of a number of different known conductive elements. For example, the first semiconductor package 100 and the second semiconductor package 200 may be connected by at least one of a solder bump, a pin, a lead, and the like. Also, regarding locations of the first semiconductor package and the second semiconductor package with respect to each other, the first semiconductor package 100 may be located on top of the second semiconductor package 200, or, on the contrary, the second semiconductor package 200 may be located on top of the first semiconductor package 100. The first semiconductor package 100 or the second semiconductor package 200 located at the bottom may further include a terminal 240 which mediates or otherwise provides an electrical connection between the PoP-type package and an external device.

The first passive element 120 may be electrically connected to the second passive element 220. Furthermore, the first passive element 120 may be directly electrically connected to the second passive element 220. The second passive element 220 may be directly electrically connected to the second semiconductor device 210. In this case, the first passive element 120 is electrically connected to the second semiconductor device 210 by only interposing the second passive element 220 therebetween. Also, the first passive element 120 may not be directly electrically connected to any of the semiconductor devices in the first semiconductor package 100. More particularly, the first passive element 120 may not be electrically connected to any of the semiconductor devices in the first semiconductor package 100.

In FIG. 4, only one second passive element 220 has been shown. However, the second passive element 220 may include a plurality of passive elements. In other words, the second passive element may be a group of a plurality of passive elements connected in series and/or in parallel.

When the first semiconductor device 110 is a non-volatile memory chip and the second semiconductor device 210 is a controller chip that controls an operation of the non-volatile memory chip, the PoP-type package in FIG. 4 may include a memory card, a part of the memory card, and a solid state drive (SSD).

Figure 5A:
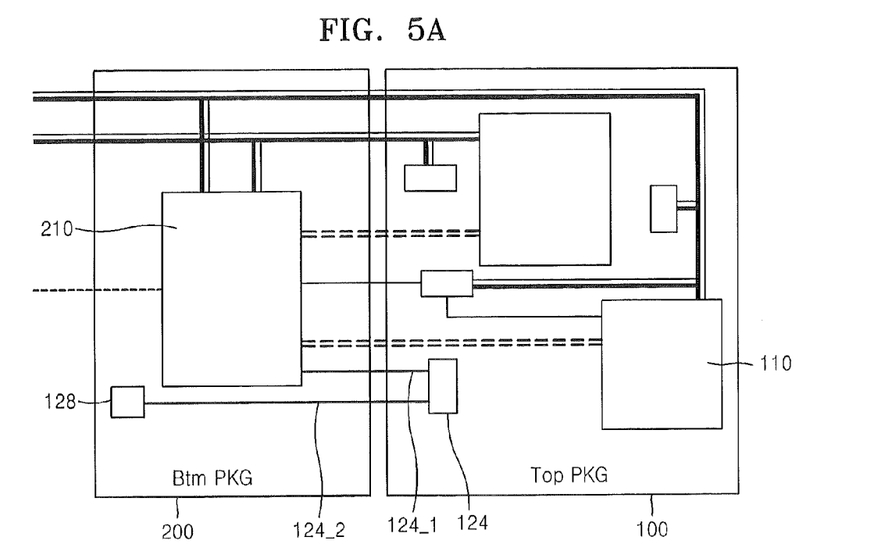
FIGS. 5A and 5B are circuit diagrams each schematically showing connections between passive elements and corresponding semiconductor devices.
Figure 5B:
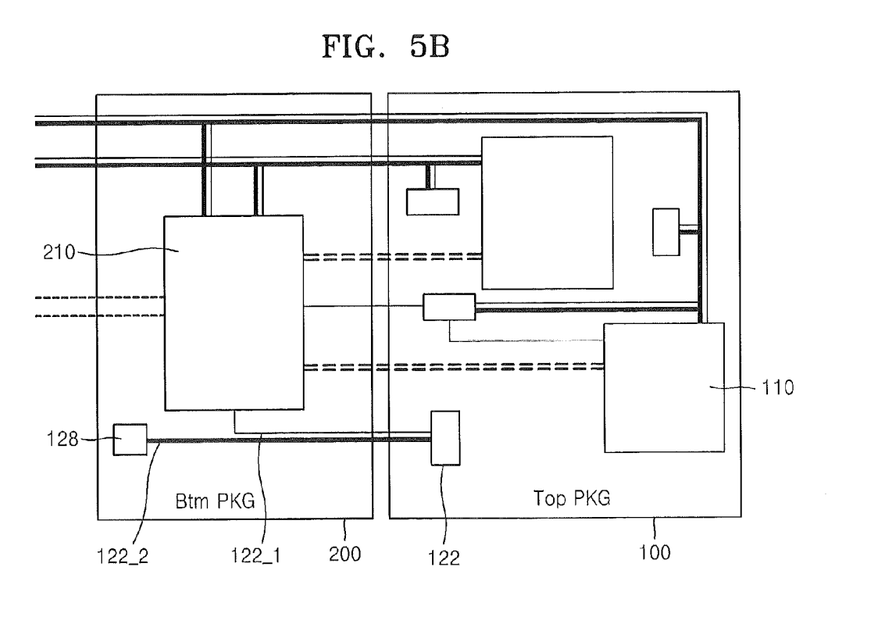

FIGS. 5A and 5B are circuit diagrams each schematically showing connections between passive elements and semiconductor devices.

First, referring to FIG. 5A, the first passive element 124 may be electrically connected to the second semiconductor device 210 through a first pathway 124_1. The first pathway 124_1 may be an electrical pathway. Furthermore, the first passive element 124 may be directly electrically connected to the second semiconductor device 210 through the first pathway 124_1.

Also, the first passive element 124 may be electrically connected to another device 128 through a second pathway 124_2. Another device 128 may be any device other than the semiconductor device 210, may be any semiconductor device other than the semiconductor device 210, and/or may be electrically connected to an external device. The second pathway 124_2 may be an electrical pathway. Furthermore, the first passive element 124 may be directly electrically connected to other device 128 through the second pathway 124_2. The other device 128 may be any semiconductor device such as the second passive element 220 in FIG. 4, or any similar electrical element. However, the inventive concept is not limited thereto.

The first pathway 124_1 and the second pathway 124_2 may be configured without an overlap. A method in which the first passive element 124 is connected to the second semiconductor device 210 without overlapping of the first pathway 124_1 and the second pathway 124_2 may be referred to as a pass-through method or configuration.

Referring to FIG. 5B, the first passive element 122 may be electrically connected to the second semiconductor device 210 through the first pathway 122_1. The first pathway 122_1 may be an electrical pathway. Furthermore, the first passive element 122 may be directly electrically connected to the second semiconductor device 210 through the first pathway 122_1.

The first passive element 122 may not be electrically connected to any other device in the first semiconductor package 100, and may only be electrically connected to the second semiconductor device 210 through the first pathway 122_1.

In some embodiments, the first passive element 122 may be electrically connected to the other device 128 through the second pathway 122_2. The other device 128 may be any device other than the second semiconductor device 210, any semiconductor device other than the second semiconductor device 210, and/or may be directly or otherwise electrically connected to an external device. The second pathway 122_2 may be an electrical pathway. Furthermore, the first passive element 122 may be directly electrically connected to the other device 128 through the second pathway 122_2.

The first pathway 122_1 and the second pathway 122_2 may be configured to overlap each other at least partially. A method in which the first passive element 122 is connected to the second semiconductor device 210 with overlapping of at least a portion of the first pathway 124_1 and the second pathway 124_2 may be referred to as a stub method or configuration. In FIG. 5B, the first pathway 122_1 and the second pathway 122_2 are shown as being separated from one another for convenience of illustration; however, the first pathway 122_1 and second pathway 122_2 may overlap in the circuit.

As shown in the embodiments of FIGS. 5A and 5B, each of the first passive elements 122 and 124 may be electrically connected to the second semiconductor device 210 using either a pass-through method or a stub method.

Figure 6:
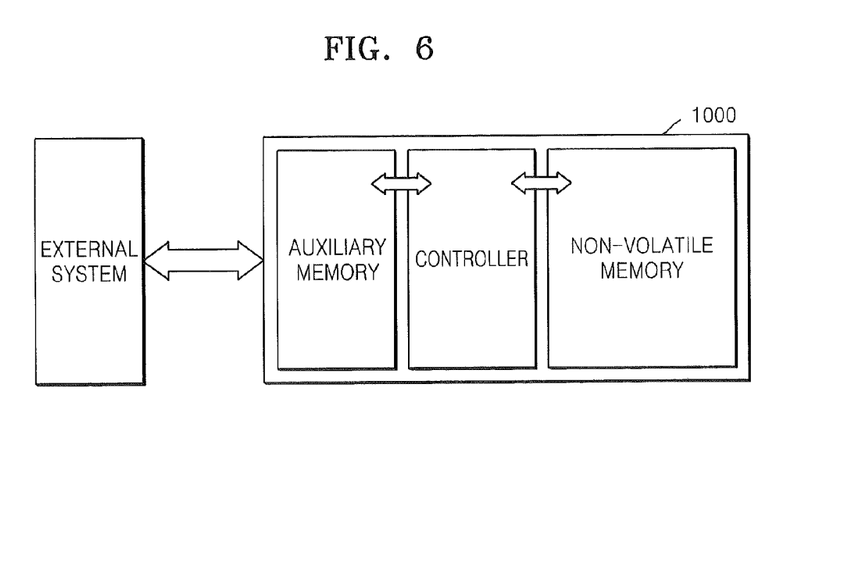
FIG. 6 is a schematic diagram showing relationships between main components of a solid state drive and an external system according to some embodiments of the present inventive concept.

FIG. 6 is a schematic diagram showing a relationship between main components of a solid state drive 1000 and an external system according to some embodiments of the present inventive concept.

Referring to FIG. 6, the solid state drive package 1000 may include a non-volatile memory for storing data and a controller for controlling input and output of data from/to the non-volatile memory and for connecting to the external system. In some embodiments, an auxiliary memory buffering a difference between data transfer speed and data reading/writing speed may be included in the solid state drive package 1000 between the controller and the external system.

As shown in FIG. 6, data input from the external system may be stored in the non-volatile memory via the controller. Herein, in order to control or account for differences in data transmission rate between the external system and the controller and data transmission rate between the controller and the non-volatile memory, a process of writing and reading data in/from the auxiliary memory may be performed. Similarly, the controller can read data from the non-volatile memory and transfer the data to the external system through the auxiliary memory.

Figure 7:
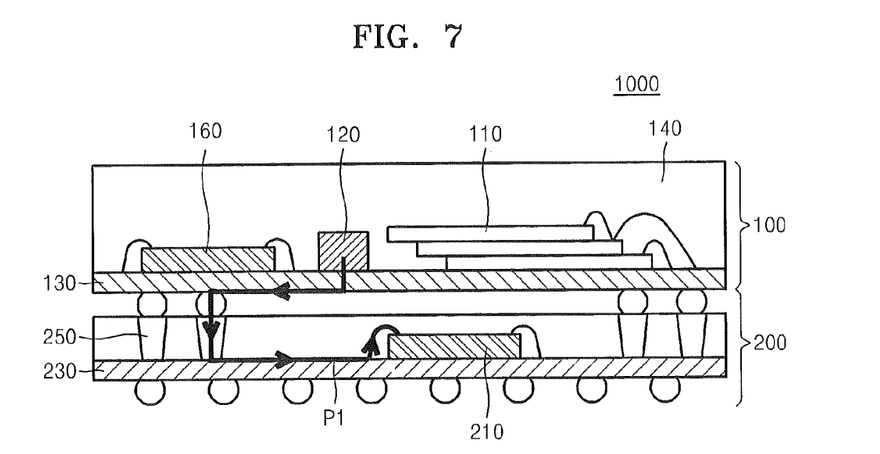
FIG. 7 is a cross-sectional view showing a solid state drive according to some embodiments of the present inventive concept.

FIG. 7 is a diagram showing a cross-sectional view of the solid state drive 1000 according to some embodiments of the present inventive concept.

Referring to FIG. 7, the solid state drive 1000 may include the first semiconductor package 100 and the second semiconductor package 200. The first semiconductor package 100 may be provided on a top surface of the second semiconductor package 200.

The first semiconductor package 100 may include the first semiconductor device 110 and the first passive element 120 on the first substrate 130. The second semiconductor package 200 may include the second semiconductor device 210 on the second substrate 230.

As shown in FIG. 7, the first passive element 120 may be directly electrically connected to the second semiconductor device 210 following a pathway labeled as P1. Also, the first passive element 120 may not be directly electrically connected to any semiconductor device in the first semiconductor package 100. In other words, the first passive element 120 may be directly electrically connected to only semiconductor devices in the second semiconductor package 200.

The first semiconductor package 100 and the second semiconductor package 200 may be connected to each other by a through-connection terminal (TCT) 250. The through-connection terminal 250 refers to a connection terminal formed by penetrating an encapsulant. The through-connection terminal 250 may be a via and may be, for example, used in a laser drilled package (LDP), through mold via (TMV), or the like.

The first semiconductor device 110 may be, for example, a flash memory, a phase-change RAM (PRAM), a resistive RAM (RRAM), a ferroelectric RAM (FeRAM), magnetic RAM (MRAM), and the like; however, the present inventive concept is not limited thereto. The flash memory may be, for example, a NAND flash memory.

The second semiconductor device 210 may be a SSD controller chip. The second semiconductor device 210 may include one or more programs that control transmitting and receiving signals to/from the external device according to a serial advanced technology attachment (SATA) standard, parallel advanced technology attachment (PATA) standard, peripheral component interconnect express (PCIe) standard, and/or small computer system interface standard (SCSI). The SATA standard not only includes SATA-1 but also all other SATA-based standards such as SATA-2, SATA-3, and external-SATA (e-SATA). The PATA standard includes all integrated drive electronics (IDE)-based standards such as enhanced-IDE (E-IDE) and the like. The serial ATA revision 2.6 published on Feb. 15, 2007 by the Serial ATA International Organization is incorporated in the present application by reference in its entirety.

Also, the second semiconductor device 210 may perform functions such as wear leveling, error correction, fail block control, etc. In some embodiments, in the second semiconductor package 200, a separate auxiliary controller chip performing functions such as wear leveling, error correction and/or fail block control may be provided.

The second semiconductor device 210 may be provided on top of the second substrate 230 as a ball grid array (BGA) package, a pin grid array (PGA) package, a tape carrier package (TCP), a chip-on-board (COB) package, a quad flat non-leaded (QFN), a quad flat package (QFP), and/or the like. However, the method is not limited thereto.

The first semiconductor package 100 may further include a third semiconductor device 160. The third semiconductor device 160 may be, for example, the auxiliary memory device or a dynamic random access memory (DRAM) device.

Figure 8:
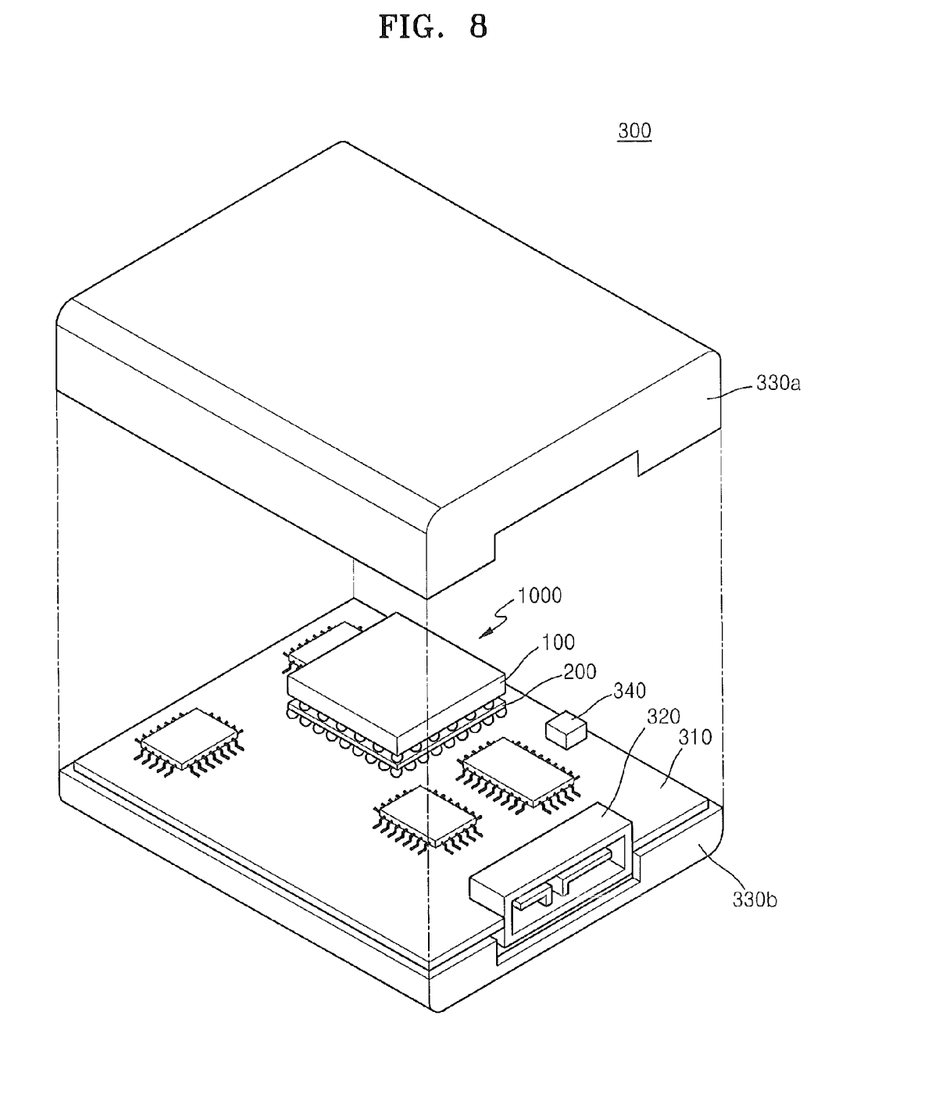
FIG. 8 is an exploded perspective view showing a data storage system according to some embodiments of the present inventive concept.

FIG. 8 is an exploded perspective view showing a data storage system 300 according to some embodiments of the present inventive concept.

Referring to FIG. 8, the data storage system includes a main board 310, and a solid state drive package 1000 mounted on the main board 310. The solid state drive package 1000 may be electrically connected to the input and output (I/O) interface terminal 320 through wiring formed on the main board 310. Also, the data storage system 300 may further include a power terminal 340 for supplying power to the main board 310. The main board 310 may be provided in a case 330a and 330b.

The I/O interface terminal 320 may form an interface between the data storage system 300 and an external device. The I/O interface terminal 320 may include a terminal for transferring signals and/or data between the data storage system 300 and the external device according to the SATA standard, the PATA standard, the PCIe standard, and/or the SCSI standard. The SATA standard includes not only the SATA-1 but also all other SATA-based standards such as the SATA-2, the SATA-3, and the e-SATA. The PATA standard includes all IDE-based standards such as IDE, E-IDE, and the like.

The data storage system 300 may be, for example, a portable data storage system, a network attached storage (NAS), or the like. The NAS may be a device capable of inputting and outputting data through a local area network (LAN) or a wide area network (WAN) according to network standards such as Ethernet or TCP/IP. Also, the I/O interface terminal 320 may be a terminal configured to accommodate the input and output (i.e., insertion and removal) of a cable according to the network standards.

Figure 9:
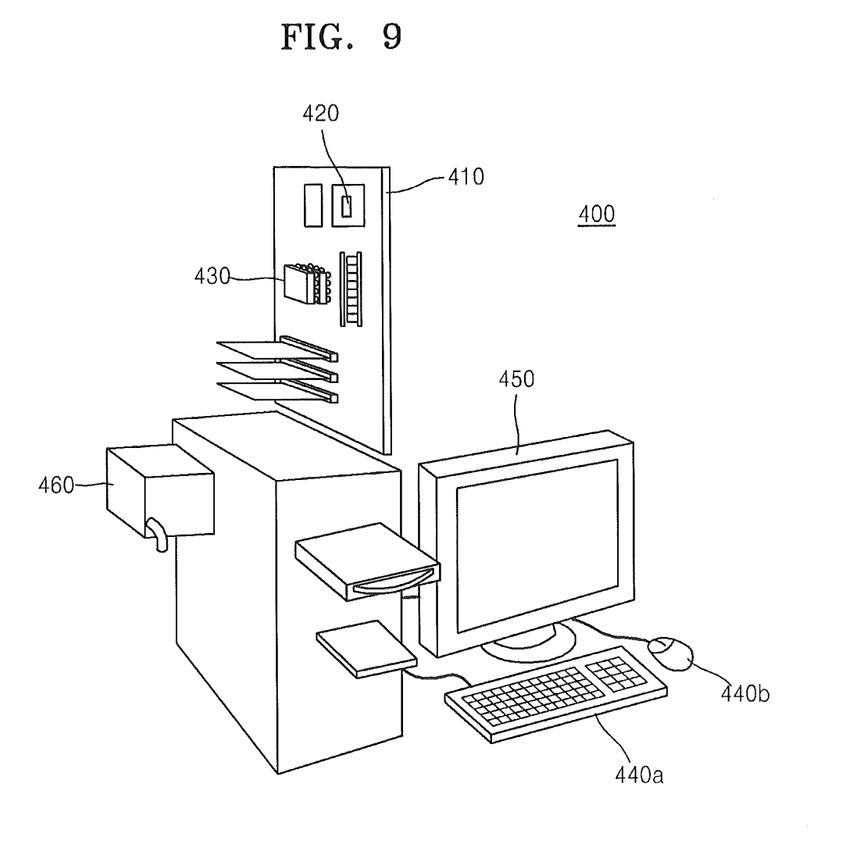
FIG. 9 is a schematic diagram showing an electronic system according to some embodiments of the present inventive concept.

FIG. 9 is a schematic diagram showing an electronic system according to some embodiments of the present inventive concept.

Referring to FIG. 9, the electronic system 400 may include the main board 410, a central processing unit (CPU) 420 mounted on the main board 410, the solid state drive package 430, input devices 440a and 440b, and an output device 450. The solid state drive package 430 may be any one of the solid state drive packages described above.

The input devices 440a and 440b may be a keyboard, a mouse, a touch screen, and the like; however, the present inventive concept is not limited thereto. The input devices 440a and 440b may be any devices capable of inputting data to the CPU 420. The output device 450 may be a monitor, a printer, and the like; however, the present inventive concept is not limited thereto. The output device 450 may be a device capable of outputting or displaying data from the CPU 420. The input devices 440a and 440b and the output device 450 may be combined in one device in some embodiments.

The solid state drive package 430 may be mounted on the main board 410. In some embodiments, the solid state drive package 430 may be mounted on the main board 410 through solder balls. The solid state drive package 430 may communicate with the CPU 420 according to the SATA standard through a conducting pattern formed on the main board 410.

A power supply device 460 is equipped in the electronic system 400. The power supply device 460 may provide power to the main board 410, etc.

The electronic system 400 may be a desktop personal computer, a laptop personal computer, a smart phone, a tablet, a notebook, a portable multimedia player (PMP), a navigation system, a flat panel display television, and the like.

It should be understood that the exemplary embodiments described herein should be considered in a descriptive sense only and not for purposes of limitation. Descriptions of features or aspects in each embodiment should typically be considered as available for other similar features or aspects in other embodiments. Accordingly, any future modification to the exemplary embodiments described herein does not depart from the spirit and scope of the present inventive concept.

What is claimed is:

1. A package-on-package (PoP)-type package, the package comprising:
   a first semiconductor package comprising a first passive element, an arbitrary passive element and a first semiconductor device adjacent one another on a first surface of a first substrate; and
   a second semiconductor package comprising a second semiconductor device on a second substrate, wherein the first semiconductor package is disposed on a top surface of the second semiconductor package;
   wherein the first passive element is directly electrically connected to the second semiconductor device,
   the arbitrary passive element is directly electrically connected to both the first semiconductor device in the first semiconductor package and the second semiconductor device in the second semiconductor package,
   the first passive element is electrically connected to the second semiconductor device by only one or more conductive interconnections and/or one or more conductive terminals between the first passive element and the second semiconductor device, the first passive element is not directly electrically connected to the first semiconductor device in the first semiconductor package,
the first semiconductor device is a memory device, and
the second semiconductor device is a controller chip that is configured to control the memory device.

2. The PoP-type package of claim 1, wherein the second semiconductor package does not include a passive element.

3. The PoP-type package of claim 1, wherein the first passive element is at least one element selected from the group consisting of a resistor, a capacitor, an inductor, a thermistor, an oscillator, a ferrite bead, an antenna, a varistor, and a crystal.

4. A package-on-package (PoP)-type package, the package comprising:
a first semiconductor package comprising a first passive element, an arbitrary passive element and a first semiconductor device adjacent one another on a first surface of a first substrate; and
a second semiconductor package comprising a second semiconductor device on a second substrate, wherein the first semiconductor package is disposed on a to surface of the second semiconductor package;
wherein the second semiconductor package further comprises at least one second passive element mounted on the second substrate;
the first passive element is directly electrically connected to the second passive element;
the first passive element is not directly electrically connected to the first semiconductor device in the first semiconductor package,
the arbitrary passive element is directly electrically connected to both the first semiconductor device in the first semiconductor package and the second semiconductor device in the second semiconductor package; and
the second passive element is directly electrically connected to the second semiconductor device.

5. The PoP-type package of claim 4, wherein:
a vertical height of the first passive element is greater than a vertical height of the second semiconductor device along a direction in which the first and second semiconductor packages are stacked.

6. The PoP-type package of claim 5, wherein sides and a top surface of the first semiconductor device are encapsulated by a molding element.

7. The PoP-type package of claim 5, wherein the second substrate further includes a terminal configured to provide an electrical connection to an external device, wherein the terminal is on a bottom surface of the second semiconductor package that is opposite the top surface including the first semiconductor package disposed thereon.

8. The PoP-type package of claim 6, wherein the vertical height of the first passive element is lower than a height of the molding element.

9. The PoP-type package of claim 7, wherein:
the first passive element is electrically connected to the second semiconductor device through a first pathway and the first passive element is electrically connected to a device other than the second semiconductor device through a second pathway; and
the first pathway and the second pathway do not overlap.

10. The PoP-type package of claim 7, wherein:
the first passive element is electrically connected to the second semiconductor device through a first pathway and the first passive element is electrically connected to a device other than the second semiconductor device through a second pathway; and
the first pathway and the second pathway overlap at least partially.

11. A package-on-package (PoP)-type solid state drive (SSD) comprising:
a first semiconductor package comprising a semiconductor memory device; and
a second semiconductor package connected to the first semiconductor package by stacking, the second semiconductor package comprising a semiconductor controller device; wherein,
the first semiconductor package further comprises a first passive element and an arbitrary passive element,
the first passive element is directly electrically connected to the semiconductor controller device,
the first passive element is electrically connected to the semiconductor controller device by only one or more conductive interconnections and/or one or more conductive terminals between the first passive element and the semiconductor controller device,
the first passive element is not directly electrically connected to the semiconductor memory device in the first semiconductor package,
the arbitrary passive element is directly electrically connected to both the semiconductor memory device in the first semiconductor package and the semiconductor controller device in the second semiconductor package, and
the first passive element is disposed directly on a surface of a substrate of the first semiconductor package, wherein the surface further includes the semiconductor memory device thereon adjacent the at least one passive element.

12. A package-on-package (PoP)-type package, comprising:
a first package comprising a first integrated circuit device, a first passive component, and an arbitrary passive component adjacent one another on a same surface of a first substrate; and
a second package comprising a second integrated circuit device on a second substrate, the second integrated circuit device having at least one dimension smaller than that of the first passive component, wherein the first and second packages are stacked and provide a direct electrical connection between the first passive component and the second integrated circuit device,
wherein the PoP-type package is free of a direct electrical connection between the first passive component and the first integrated circuit device,
the first integrated circuit device comprises a stack of semiconductor memory chips having a height greater than or equal to that of the first passive component, and
wherein the second integrated circuit device comprises a memory controller device having a height less than that of the first passive component,
the direct electrical connection between the first passive component and the second integrated circuit device consists of a conductive wire and/or a conductive terminal, and
the arbitrary passive component is directly electrically connected to the first integrated circuit device in the first package and the second integrated circuit device in the second package.

13. The PoP-type package of claim 12, wherein the passive component is associated with operation of the second integrated circuit device, and wherein the second integrated circuit device is configured to control operation of the first integrated circuit device.

* * * * *